United States Patent [19]

Hipps, Sr. et al.

[11] Patent Number: 5,079,126

[45] Date of Patent: Jan. 7, 1992

[54] PHOTOHARDENABLE COMPOSITION CONTAINING FIVE MEMBER AROMATIC GROUP WITH IMINE MOIETY

[75] Inventors: Jesse Hipps, Sr., Miamisburg; Claire M. Plageman, Cincinnati, both of Ohio

[73] Assignee: The Mead Corporation, Dayton, Ohio

[21] Appl. No.: 574,552

[22] Filed: Aug. 27, 1990

Related U.S. Application Data

[63] Continuation of Ser. No. 294,246, Jan. 9, 1989, abandoned.

[51] Int. Cl.$^5$ ............................................. G03E 7/029
[52] U.S. Cl. .................................. 430/138; 430/281; 430/914; 522/14; 522/15; 522/8
[58] Field of Search ................ 430/281, 138, 554, 580; 522/8, 16, 26, 15, 25, 14

[56] References Cited

U.S. PATENT DOCUMENTS

| | | | |
|---|---|---|---|
| 2,772,161 | 11/1956 | Loria et al. | 430/554 |
| 2,899,443 | 8/1959 | Schulze | 430/554 |
| 3,060,023 | 10/1962 | Burg | 430/254 |
| 3,099,558 | 7/1963 | Levinos | 522/26 |
| 3,617,287 | 11/1971 | Jeffers | 522/26 |
| 4,259,432 | 3/1981 | Kondoh et al. | 430/281 |
| 4,290,870 | 9/1981 | Kondoh et al. | 522/16 |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,522,694 | 6/1985 | Schaefer | 522/16 |
| 4,555,474 | 11/1985 | Kawamura et al. | 430/281 |
| 4,609,620 | 9/1986 | Postle et al. | 430/554 |
| 4,772,530 | 9/1988 | Gottschalk et al. | 430/138 |
| 4,772,541 | 9/1988 | Gottschalk et al. | 430/339 |
| 4,788,125 | 11/1988 | Davis et al. | 430/138 |
| 4,800,149 | 1/1989 | Gottschalk et al. | 430/138 |
| 4,804,611 | 2/1989 | Geis | 430/138 |
| 4,937,161 | 6/1990 | Kita et al. | 430/281 |
| 4,963,461 | 10/1990 | Takahashi et al. | 430/138 |

OTHER PUBLICATIONS

"Acyl" and "Benzoyl", Hackh's Chemical Dictionary, fourth edition, McGraw-Hill Book Co., N.Y., N.Y., pp. 16, 91.

*Primary Examiner*—Marion E. McCamish
*Assistant Examiner*—Christopher D. RoDee
*Attorney, Agent, or Firm*—Thompson, Hine and Flory

[57] ABSTRACT

A photohardenable composition comprising an addition polymerizable or crosslinkable material, a photoinitiator composition capable of initiating polymerization or crosslinking of said polymerizable or crosslinkable material, and a compound of the formula

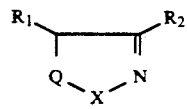

wherein Q represents —C=O or —C—OH; X represents S or N which is unsubstituted or substituted with alkyl or aryl groups;

$R_1$ represents H, alkyl, aryl, alkoxy, bezoyl, arloxy, acyl or monosubstituted amino groups; and $R_2$ represents H, alkyl or aryl groups is disclosed. The composition is preferably contained in microcapsules and is used in photosensitive imaging systems. The five member aromatic group containing the imine moiety functions to reduce the likelihood of short time scale reciprocity failure of the composition and enable imaging using high intensity radiation sources. An imaging method using the inventive composition is also disclosed.

10 Claims, 2 Drawing Sheets

FIG. 1

FIG. 2A 500 millisec exposure

FIG. 2B

10 μsec Exposure

PHOTOHARDENABLE COMPOSITION CONTAINING FIVE MEMBER AROMATIC GROUP WITH IMINE MOIETY

This is a continuation of co-pending application Ser. No. 294,246, filed Jan. 9, 1989, no abandoned.

BACKGROUND OF THE INVENTION

1. Field of the Invention

The present invention relates to a photohardenable composition which is used for producing images. More specifically, the composition includes a five member aromatic group containing an imine moiety to cause the photohardenable composition to be less susceptible to short time scale reciprocity failure caused by the reversal phenomenon.

2. Description of the Prior Art

Photosensitive imaging systems employing microencapsulated radiation sensitive compositions are the subject of commonly assigned U.S. Pat. Nos. 4,399,209 and 4,416,966 to The Mead Corporation as well as U.S. Pat. Nos. 4,772,530 and 4,772,591, also assigned to The Mead Corporation. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Image-wise exposure hardens the internal phase of the microcapsules as a result of the photoinitiator generating free radicals which initiate polymerization of the polyethylenically unsaturated compound by free radical addition polymerization. Following exposure, the imaging sheet is subjected to a uniform rupturing force by passing the sheet between a pair of pressure rollers.

U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules rupture and image-wise release the internal phase whereupon the color-former migrates to the developer sheet where it reacts with a dry developer and forms a color image. The imaging system can be designed to reproduce monochromatic or polychromatic full color images.

U.S. Pat. No. 4,440,846 discloses a so called "self-contained" imaging system wherein both the image-forming agent and the developer material are located on the same substrate. In the system according to U.S. Pat. No. 4,440,846, the image-forming agent is encapsulated in a layer of pressure rupturable capsules, and the capsules are exposed and ruptured to cause the image-forming agent to contact and react with the developer to produce an image on the substrate.

A phenomenon known as reversal which has caused some photosensitive compositions to experience short time scale reciprocity failure has limited the use of imaging systems containing these compositions to lower intensity radiation sources for longer periods of time. Certain high intensity light sources, such as lasers, useful in high speed copying have not been used effectively because the photohardenable compositions do not polymerize in direct proportionality to the amount of exposure intensity.

At time scales less than 0.1 seconds, two types of reciprocity failure have been observed to occur with various types of photosensitive material. Failure of the first type occurs around 0.001 seconds for most systems and results in a progressive loss of sensitivity down to about 1 microsecond. The total loss at 1 microsecond, compared to 1 second, is expected to be about a factor of 10 for most systems. Whether further losses below the microsecond level occur by this type of failure is not known. The mechanistic cause of the failure is believed to be a chemical inefficiency due to high concentrations of free radicals The radicals react with each other rather than doing the chemistry expected of them.

The second type of failure at short time scales is found in a few types of photosensitive materials. When this type of failure occurs, it is quite severe, causing an instant loss of a factor of 10 in sensitivity. This catastrophic loss has been observed to occur in different systems ranging from seconds to microseconds regions. The present invention seeks to reduce the risk of reversal caused by this type of reciprocity failure.

Figure 1:
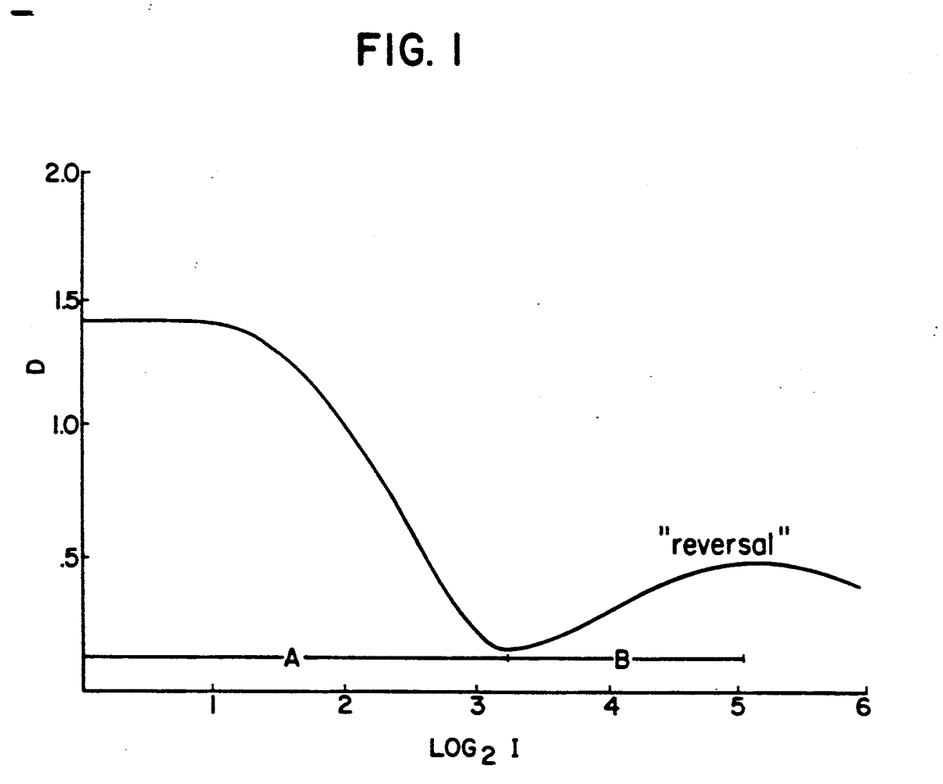
FIG. 1 depicts an H & D curve of a photosensitive composition which exhibits short time scale reciprocity failure.

Most scientists who deal with photographic materials are familiar with the "H & D" (D log H) curve. The H & D curve characterizes the way in which a photographic material responds to light. An H & D curve is shown in FIG. 1. If the system is "well behaved", there is a relationship between energy or exposure and image density which defines the energy requirements of an exposure device. This region is represented by A on FIG. 1. In other areas, as is represented by B on FIG. 1, the imaging system is not well behaved and results in a reverse proportionality between increased exposure and density. The region represented by B is the "reversal region" and depicts the second type of failure referred to above (i.e., short time scale reciprocity failure).

In well behaved regions of an H & D curve, for a given photosensitive material the degree of polymerization is essentially a function of exposure. Exposure may be quantitatively expressed as a product of the intensity of the radiation source and the time of exposure. Accordingly, these two variables can be appropriately manipulated to provide a given exposure. In theory, as long as the desired exposure is obtained by any manipulation of intensity and time, a predetermined amount of polymerization should occur.

In regions where short time scale reciprocity failure occurs, the rate of polymerization slows to a point at which the photohardenable composition never fully polymerizes. A given level of exposure does not produce a corresponding degree of polymerization. When the photohardenable composition is microencapsulated and used in the aforementioned imaging systems, the system is unable to reach Dmin in the reversal region.

The reversal phenomenon varies widely amongst systems containing photosensitive materials. For some systems, reversal can occur only when subjecting the photosensitive composition to intensities and exposure times which cannot practically be achieved using present technology. For these systems short time scale reciprocity failure does not pose a serious problem. For other systems, short time scale reciprocity failure can pose a problem which must be overcome to enable the production of images. The problems are particularly apparent in systems which are subjected to high intensity radiation.

While not wishing to be bound by any particular theory, it is believed that short time scale reciprocity failure is in large part a function of the monomer used and the type and concentration of the photoinitiator. In systems where noticeable short time scale reciprocity failure occurs, it is hypothesized that termination reactions occur at a faster rate than the propagation reactions as a result of either the photoinitiator being depleted in the microcapsules before the monomer has had an opportunity to polymerize, or by the creation of a polymerization inhibitor or a radical scavenger in the microcapsules. Moreover, once the photosensitive material has encountered failure as a result of "reversal", the reversal effect cannot be corrected.

For some photosensitive materials, it has been difficult, if not impossible, to develop a system utilizing high intensity short time scale exposures because of the risk of reversal. When utilizing photopolymerizable systems as described above for copying documents, it is desirable to minimize the time of exposure to enable the production of copies at a fast rate. In systems which exhibit noticeable short time scale reciprocity failure, lower intensity radiation sources, and accordingly, longer exposure times are required to produce images. Accordingly, the number of copies produced per minute in such systems have been limited.

In addition, it has long been desired to utilize high intensity sources such as lasers as light sources for photosensitive imaging systems because of their monochromatic spectral characteristics and their ability to be easily controlled, such as by computer control as is known in the art. The use of lasers has been limited in some photosensitive systems as the high intensities of the lasers have caused some photosensitive materials to exhibit short time scale failure due to the reversal phenomenon.

Attempts have been made in the art to remedy the susceptibility of a photosensitive composition to reversal upon exposure. For example, in U.S. application Ser. No. 255,907, filed Oct. 10, 1988, the likelihood of short time scale reciprocity failure is reduced by the addition of a high viscosity material to the photohardenable composition. Examples of the viscosity additives are reactive monomers such as dipentaerythritol hydroxypentaacrylate, or non-reactive materials such as waxes. Although these materials do function to reduce the risk of reversal to some extent, they suffer from a minor number of drawbacks. First, the amount of high viscosity additive must be limited in order to enable manufacture of the photohardenable composition. The limitation of the amount of additive present in the photohardenable composition functions to lower, but not completely remove the risk of reversal. In addition, the photohardenable composition containing the viscosity modifier is limited in performance at high temperatures, typically above 30 to 35° C. Finally, the viscosity additive composition tends to lose film speed in the toe portion of the H & D curve over extended periods of time, thereby reducing the quality of image produced by a composition which has been stored for extended periods of time.

U.S. Pat. No. 4,290,870, assigned to Fuji Photo discloses a photopolymerizable composition. The composition includes an addition-polymerizable ethylenically unsaturated compound and a photoinitiator which includes the combination of a 5-isoxazolone and another co-initiator material.

Accordingly, there exists a need in the art for a photohardenable composition which is less susceptible to reversal, which is able to produce high contrast images, which is functional over a broad temperature band, and which has an extended shelf life.

DEFINITIONS

The term "reversal time" refers to the exposure time for a given exposure (E) (where E equals intensity (I) X Time (t)) below which the photosensitive material is unable to reach Dmin. At exposure time greater than the reversal time for a given exposure (I X t), Dmin is reached, i.e., the photosensitive material obeys reciprocity and does not exhibit reversal (we assume in this discussion that exposure times do not become so great that another mechanistic phenomenon known as long time scale reciprocity failure occurs. See Arney, "Oxidation Kinetics and Reciprocity Behavior in the Microencapsulated Acrylate Imaging Process," *J. Imaging Science* 31:27–30 (1987)). Increases in intensity for exposure time periods less than the reversal time produces proportional increases in image density.

SUMMARY OF THE INVENTION

In accordance with the present invention, a photohardenable composition resistant to catastrophic short time scale reciprocity failure is disclosed. The composition is characterized by having as an additive a five member aromatic group containing an imine moiety to shorten the reversal time of the composition and thereby enable the use of high intensity, short time exposures. While not completely understood, the presence of the aromatic additive alters the chemical properties of the internal phase to reduce the reversal time of the composition.

For purposes of this invention, the tendency for a composition to undergo reversal is expressed as its reversal time. Assuming that the exposure required for polymerization is a given value, and that the intensity of the radiation source is constant, the exposure time of the photosensitive composition to the radiation source may be easily determined by dividing the exposure by the intensity of the radiation source. If the exposure time is greater than the reversal time, the photosensitive composition obeys reciprocity and does not reverse. If the exposure time is less than the reversal time, the photosensitive composition is subject to the reversal phenomenon and does not obey reciprocity. In the present invention, reversal time is shortened thus enabling higher intensity, short time scale radiation sources such as commercially available lasers to be utilized. If the photosensitive composition is utilized to produce copies, more copies per minute can be produced. The inventors have discovered that the reversal time for a material can be shortened by adding a five member aromatic group containing an imine moiety to the material.

The relationship between the presence of the aromatic additive in the internal phase and the reversal time is explained in the following hypothetical example. If the theoretical exposure required for polymerization of a material is 2000 erg/cm$^2$ and the radiation source selected delivers energy at an intensity of 1000 erg/sec. cm$^2$, the source must be activated for 2 seconds to effectuate polymerization. If the reversal time for the hypothetical material is 4 seconds, the reversal phenomenon will set in as the reversal time is greater than the exposure time and the composition will either not polymerize or will polymerize at a much slower rate than expected. According to the present invention, a five member aromatic group containing an imine moiety is added to the internal phase to shorten the reversal time. If the above hypothetical resulting composition has a reversal time of one second, when using the same radiation source, the modified material can polymerize. It is not completely understood why the aromatic additive shortens the reversal time; nonetheless, the presence of the aromatic additive clearly reduces the risk of the composition from exhibiting short time scale failure.

In accordance with one embodiment, the present invention comprises an addition polymerizable or crosslinkable material, a photoinitiator composition capable of initiating polymerization or crosslinking of said polymerizable or crosslinkable material and a compound of the formula wherein Q represents $<C=O$; X represents S or N which is unsubstituted or substituted with alkyl or aryl groups;

$R_1$ represents H, alkyl, aryl, alkoxy, benzoyl, arloxy, acyl or monosubstituted amino groups; and $R_2$ represents H, alkyl or aryl groups.

Particularly good results in terms of reversal control are obtained when the aromatic additive is a pyrazolone compound. It is further preferred that the photohardenable composition be maintained in the internal phase of microcapsules, and that the microcapsules have an image-forming agent associated with them.

In yet another embodiment, the present invention relates to a photosensitive material comprising a substrate having a coating containing a photohardenable material on the surface thereof, the photohardenable material being as defined above. More particularly, it is preferred that the photohardenable material be coated as a layer of photosensitive microcapsules.

In accordance with another embodiment, the present invention comprises a photohardenable composition comprising an addition polymerizable or crosslinkable material, a photoinitiator composition capable of initiating polymerization or crosslinking of said polymerizable or crosslinkable material, said photoinitiator composition comprising an ionic dye-reactive counter ion compound, and a compound of the formula wherein Q represents $<C=O$; X represents S, O or N which is unsubstituted or substituted with alkyl or aryl groups;

$R_1$ represents H, alkyl, aryl, alkoxy, benzoyl, arloxy, acyl or monosubstituted amino groups; and $R_2$ represents H, alkyl or aryl groups.

The composition is preferably maintained in the internal phase of photosensitive microcapsules.

In yet another embodiment, the present invention relates to a method for producing images. The method includes the steps of providing photosensitive microcapsules as defined above;

image-wise exposing the photosensitive microcapsules to actinic radiation for a period of time longer than the reversal time of the photosensitive microcapsules;

providing a receiver sheet; and subjecting the microcapsules to a uniform rupturing force to cause the image-forming agent to migrate to the receiver sheet and form an image. If the image-forming agent is a colorless color-forming agent which requires the presence of a developer material to form an image, the receiver sheet is provided with such a developer material. The receiver sheet may be located remote from the microcapsules to form a transfer system or may contain the microcapsules to form a self-contained system.

Accordingly, it is an object of the present invention to provide a photosensitive composition having a shortened reversal time.

It is a further object of the present invention to provide a photosensitive composition capable of producing high contrast images.

An additional object of the present invention is to provide a photocopy system which is capable of producing photocopies at increased rates.

It is an additional object of the present invention to provide a method for producing images wherein high intensity radiation sources, such as lasers may be utilized.

These, and other objects will be readily recognized and understood by one skilled in the art as reference is made to the following detailed description of the preferred embodiments.

DETAILED DESCRIPTION OF THE PREFERRED EMBODIMENTS

While describing the preferred embodiments, certain terminology will be utilized for the sake of clarity. It is to be understood that such terminology includes not only the recited embodiments, but all technical equivalents which perform substantially the same function in substantially the same way to obtain the same result.

The present invention comprises a photohardenable composition, preferably in the form of microcapsules. The microcapsules include a photoinitiator in the internal phase. Photohardenable compositions such as photopolymerizable and photocrosslinkable materials increase in viscosity or solidify upon exposure to radiation. Also included in the photohardenable composition is a five member aromatic additive containing an imine moiety which functions to shorten the reversal time of the microcapsules. In association with the microcapsules is an image-forming agent.

Various radiation curable materials, photoinitiators, aromatic additives, and image-forming agents can be used in conjunction with the photographic materials of the present invention.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from the Richardson Company, Melrose Park, Ill., such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J., under the tradename of Sun Cure resins.

The radiation sensitive component of several radiation curable inks is also suitable for use in this invention. An example of this type of material is a mixture of pentaerythritol acrylate and a halogenated aromatic, alicyclic or aliphatic photoinitiator, as disclosed in U.S. Pat. No. 3,661,614 to Bessemir et al.

The photoinitiator is capable of absorbing actinic radiation and producing free radicals capable of initiating free radical polymerization of the polymerizable or crosslinkable compound. A preferred photoinitiator system for use in the present invention includes ionic dye-reactive counter ion compounds described in U.S. Pat. Nos. 4,772,580 and 4,772,591. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators potentially useful in the present invention may be selected from among diaryl ketone derivatives, quinones, benzoin alkyl ethers, alkoxy phenyl ketones, O-acylated oximinoketones, polycyclic quinones, phenanthrenequinone, naphthoquinone, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes, and hexaarylbiim;idazoles (lophine dimers). In many cases it is advantageous to use a combination of imaging photoinitiators.

The five member aromatic reversal control additive is preferably of the formula (I)

wherein Q represents $<C=O$; X represents S or N which is unsubstituted or substituted with alkyl or aryl groups;

$R_1$ represents H, alkyl, aryl, alkoxy, benzoyl, arloxy, acyl or monosubstituted amino groups; and $R_2$ represents H, alkyl or aryl groups. Further, when the photoinitator comprises an ionic dye-reactive counter ion compound, X may also represent an oxygen atom. Examples of such compounds according to formula (I) are set forth in U.S. Pat. No. 4,609,620. Pyrazolones are known in the art as color coupling agents for silver halide photographic systems. It is anticipated that other pyrazolones which are useful as color couplers may also be useful in the present invention.

Preferred compounds of formula (I) are pyrazolone compounds. Examples of such compounds include 4-benzoyl-3-methyl-1-phenyl-2-pyrazoline-5-one, 3-methyl-1-phenyl-2-pyrazoline, picrolonic acid, 1-(2,4,6-trichlorophenyl)-3-(p-nitroanilino)-2-pyrazoline-5-one, 1,5-dimethyl-2-phenyl-3-pyrazolone, 4-amino-antipyrine and 3-methyl-1-phenyl-2-pyrazoline-5-one. Of the above listed compounds, 4-benzoyl-3-methyl-1-phenyl-2-pyrazoline-5-one (BMPP) has proven to be particularly effective additives.

The amount of additive of Formula (I) should range from about 0.01 to about 1.1 parts per 100 parts of photohardenable composition.

To improve the film speed of the photohardenable composition it may be advantageous to include an autoxidizer and/or other additive materials in the photohardenable composition. An autoxidizer is a compound which is capable of consuming oxygen in a free radical chain process.

Examples of useful autoxidizers are N,N-dialkylanilines. Particularly preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline and p-t-butyl-N,N-dimethylaniline.

It may also be desirable to utilize an additional material to improve the photosensitive properties of the photohardenable composition such as film speed. Examples of these compounds include thiols such as acylthiohydroxamates, 2-mercapto-benzothiazole, 6-ethoxy-2-mercaptobenzothiazole, 2-mercaptobenzoxazole, phenylmercaptotetrazole, and heptylmercaptotriazole. Disulfides of the above listed thiol compounds are also useful additives.

The autoxidizers and/or additive compounds are preferably used in the present invention in concentrations of about 0.1 to 10 percent by weight of the photohardenable composition.

Various image-forming agents can be used in association with the photohardenable composition. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself can also have its own image-forming capability. For example, it is known that many of the toners used in xerographic recording processes selectively adhere to the image areas of an imaging sheet exposed and developed as in the present invention.

As explained in U.S. Pat. No. 4,399,209, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated image-receiving sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone, and Copikem X, IV and XI (products of Hilton-Davis Chemical Co.) and Reakt Yellow (a product of BASF) are often used alone or in combination as color precursors in the present invention, as are commercially available cyan, magenta and yellow color forming agents.

The discrete walled microcapsules used to encapsulate the internal phase in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Patent No. 4,025,455 to Shackle). A melamine-formaldehyde capsule is particularly preferred as described in commonly assigned U.S. application Ser. No. 128,292, filed Dec. 3, 1987.

The mean microcapsule size used in the present invention generally ranges from about 1 to 25 microns.

To produce an imaging sheet containing the microcapsules, the microcapsules are coated onto a substrate. The most common substrate for imaging sheets in accordance with this invention is a transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar (PET). The microcapsules can be located on either the top or bottom surface of a transparent substrate to form an imaging sheet.

To produce a positive image, the substrate is imagewise exposed to actinic radiation, preferably wavelengths in either the ultraviolet, visible or infrared range. Moreover, the intensity of the radiation source must be such that the photosensitive composition does not undergo reversal (i.e., the source must be selected so that the exposure time required for polymerization exceeds the reversal time). As the inventive composition possesses a shorter reversal time, higher intensity sources can be used. Conversely, because the compositions have shorter reversal times, they can be exposed for shorter periods of time (with higher intensity sources) without reversing. A typical 1 exposure intensity exceeds 2000 ergs/cm$^2$ and may range from about 1000 ergs/cm$^2$ to about 100,000 ergs/cm$^2$. In the preferred embodiment, high intensity light sources such as lasers and high wattage visible light sources (e.g. tungsten halogen sources) are used as the radiation source. Further, the exposure time typically ranges from microseconds to seconds. Moreover, because of the shorter exposure times required for exposure, more exposures, and hence, more copies can be produced per minute. If the reversal time is reduced to below a milliseconds time frame, commercially available lasers can be utilized as the light source.

After the exposure step, the microcapsules on the substrate are subjected to a uniform rupturing force to release their contents and form a positive image.

Where the image-forming agent is not a dye or pigment, a developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120 zinc carbonate etc. and mixtures thereof. A preferred class of glossable developers is described in commonly assigned U.S. application Ser. No. 073,036, filed July 14, 1987.

The developer material may be located on a support separate from the imaging sheet to thereby form a transfer image coating system as described in U.S. Pat. No. 4,399,209. In such a system the imaging sheet and the developer sheet are brought together in the presence of a uniform rupturing force to cause the image-forming agent to migrate to the developer sheet and form an image on the developer sheet. The support may be made of paper, or a transparent film such as polyethylene terephthalate.

Alternatively, the developer material may be located on the same surface as the layer of microcapsules to form a self-contained sheet as described in U.S. Pat. No.

4,440,846. In this configuration, the substrate is coated with a first coating of developer material and then a second coating of the photosensitive microcapsules. Alternatively, the microcapsules and developer material can be admixed and coated as a single layer as is readily understood in the art.

By performing the above-described method, images are produced on the substrate. Moreover, as the images can be produced using higher intensity exposures for shorter periods of time, radiation sources such as commercially available lasers can be utilized. This is a clear advantage over prior art photohardenable materials which required lower intensity, longer exposures to produce images as higher intensity exposures would subject the prior art compounds to reversal.

The present invention may be utilized to produce monochromatic or full color images. Full-color imaging systems are described in U.S. Pat. No. 4,576,891, European Published Application No. 0223587 and U.K. Patent No. 2,113,860. These systems employ imaging sheets having three sets of microcapsules which respectively contain cyan, magenta and yellow color precursors. As explained in more detail in the above-listed references, each set of microcapsules is primarily sensitive in a different wavelength band such that the microcapsules can be individually exposed with minimum cross-talk. In panchromatic systems, the cyan, magenta, and yellow forming photosensitive microcapsules are respectively sensitive to red, green and blue light.

In accordance with the present invention, at least one of the three sets of microcapsules preferably contains a photohardenable composition including the reversal control additive. Further, for each set of microcapsules, the composition selected is sensitive to a different wavelength band. For color forming microcapsules which do not exhibit short time scale reciprocity failure under typical operating conditions, no reversal control additives need to be added to the respective internal phases.

To produce full-color images, each set of microcapsules is image-wise exposed to actinic radiation. This requires exposures of three different wavelengths, each wavelength corresponding to the sensitivity of the photohardenable composition selected for the corresponding set of microcapsules. The three different wavelengths may be provided from one broad band radiation source or three independent monochromatic radiation sources.

In a panchromatic system, it is envisioned that green, blue, and red lasers may be used for the exposures. These processes rely upon image process techniques which are well known in the art. It is further contemplated that a high intensity white light source containing at least three distinct bands of actinic radiation may be used for the short term exposures. Because of the presence of the reversal control additives, as discussed above, the materials are able to withstand high intensity, short term exposures without undergoing reversal (as long as the exposure time to effectuate radiation for a source of a given intensity exceeds the reversal time of the composition).

After exposure, the substrate is brought into contact with a developer material, and the microcapsules are ruptured in the presence of the developer material to produce a full color image.

The addition of the reversal control additive provides a number of benefits to the photohardenable composition other than the lowering of the composition's reversal time. As will be demonstrated in the examples, the addition of the reversal control additive improves the film speed of the photohardenable composition. This, in turn, causes the dynamic range of the photohardenable composition to be shorter, and thereby enables the production of highly contrasted images. As a result, the photosensitive behavior of the composition is nearly digital. Because the film speed of the composition is enhanced, more copies per minute may be produced.

If, however, a more continuous tone image is desired, a short non-image-wise exposure, as is known in the art, may be performed prior to the high intensity short time image-wise exposure. Examples of this technique are described in greater detail in U.S. Pat. No. 4,482,624.

Further, the photohardenable composition shows a consistent photographic behavior over a relatively broad temperature band, typically ranging from about 15° C. to about 70° C. This is desirable because, as the copying machines which use the inventive photohardenable composition typically operate at ambient conditions, the photohardenable composition may be exposed and developed without running a significant risk of contamination caused by high or low temperature ambient conditions.

In addition, when maintained in relatively small amounts, the presence of the reversal control additive does not show an appreciable loss in photographic properties over an extended period of time. This is important as, to enable the inventive photohardenable material to be a viable commercial product, it must maintain an adequately long shelf life.

The invention is illustrated in more detail by the following non-limiting examples:

COMPARATIVE EXAMPLE 1

As a control, the following internal phase was encapsulated in melamine-formaldehyde microcapsules:

| Component | Amount |
|---|---|
| Trimethylolpropane triacrylate (TMPTA) | 80 parts |
| Dipentaerythritol hydroxypentaacrylate (DPHPA) | 20 parts |
| 1,1'-di-n-heptyl-3,3,3',3'-tetramethyl-indocarbocyanine triphenyl-n-butylborate (Example 1 Initiator) | .3 parts |
| 2,6-diisopropyl-N,N-dimethyl aniline (DIDMA) | 6 parts |
| Magenta color precursor | 24 parts |
| Desmodur N-100 Isocyanates (N-100) | 6.6 parts |

Figure 2A:
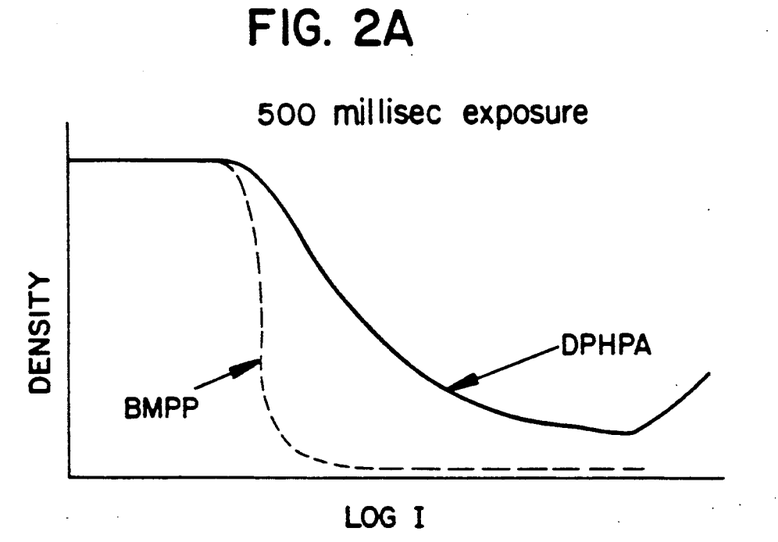
FIGS. 2A and 2B are H & D curves developed from the experiments of Comparative Example 1 and Example 1.
Figure 2B:
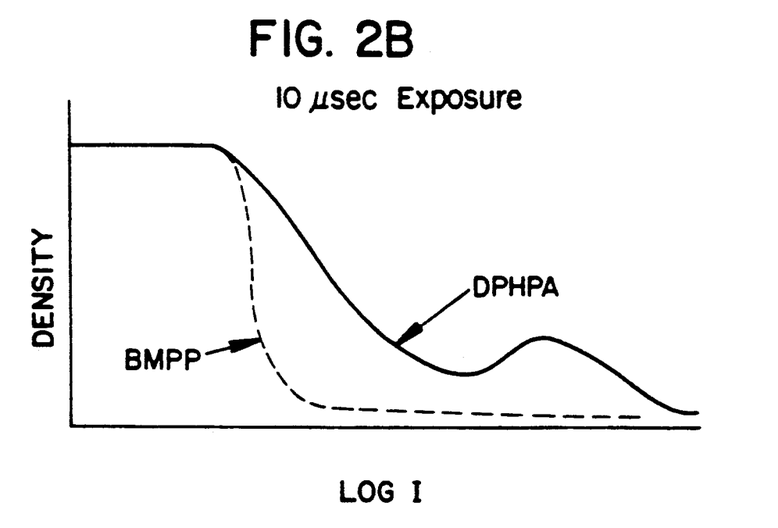

To determine the photosensitive performance of the composition, the composition was first exposed to light through a step wedge at a distance of 1½ inches using a 500 watt tungsten halogen source and brought into contact with a developer material. The H & D curves for the material at an exposure time of 500 milliseconds is shown in FIG. 2A. The experiment was repeated except that the composition was exposed to light from a 30 milliwatt green laser. The H & D curve for the material at an exposure time of 10 microseconds is shown in FIG. 2B.

EXAMPLE 1

The experiments of Comparative Example 1 were repeated except that the following internal phase was encapsulated:

| Component | Amount |
| --- | --- |
| TMPTA | 100 parts |
| Example 1 Initiator | .3 parts |
| DIDMA | 6 parts |
| Magenta color precursor | 24 parts |
| N-100 | 6.6 parts |
| 4-benzoyl-3-methyl-1-phenyl-2-pyrazoline-5-one (BMPP) | 0.01 parts |

The H & D curves for the material at exposure times of 500 milliseconds and 10 microseconds are shown in FIGS. 2A and 2B. The material obeyed reciprocity into the microseconds time domain. Similar results were obtained by using different amounts of BMPP ranging from between 0.004 and 1.1 parts per 100 parts TMPTA.

COMPARATIVE EXAMPLE 2

The following internal phase was encapsulated in melamine-formaldehyde microcapsules:

| Component | Amount |
| --- | --- |
| TMPTA | 100 parts |
| Example 1 Initiator | .27 parts |
| DIDMA | 1.00 parts |
| Magenta Color Precursor | 19 parts |
| N-100 | 6.7 parts |

The microcapsules were exposed to a 500 watt tungsten halogen light source at a distance of 1½ inches through a step wedge to evaluate reversal behavior. The reversal time and dynamic range are shown in Table 1.

COMPARATIVE EXAMPLE 3

The experiment of Comparative Example 2 was repeated with the exception that instead of using 100 parts of TMPTA, 80 parts of TMPTA and 20 parts of DPHPA were contained in the internal phase. The reversal time and dynamic range are shown in Table 1.

EXAMPLE 2

The experiment of Comparative Example 2 was repeated with the exception that 0.5 parts of 3-phenyl-5-isoxazolone (PIAZ) were added to the internal phase. The reversal time and dynamic range are shown in Table 1.

EXAMPLE 3

The experiment of Comparative Example 2 was repeated with the exception that .008 parts of BMPP were added to the internal phase. The reversal time and dynamic range are shown in Table 1.

TABLE 1

| Sample | Reversal Time $t_r$ (sec) | Dynamic range @ $t_r$ |
| --- | --- | --- |
| Comparative Example 2 | >2.00 | 15.0 |
| Comparative Example 3 | .96 | 14.0 |
| Example 2 | .48 | 9.0 |
| Example 3 | 0.0001 | 4.5 |

COMPARATIVE EXAMPLE 4

The composition of Comparative Example 2 was exposed to the light source of Comparative Example 2 for 0.5 seconds at temperatures ranging from 15° C. to 70° C. The sensitivity change in both the shoulder and toe of the H & D curve (measured in stops) is set forth in Table 2.

COMPARATIVE EXAMPLE 5

The experiment of Comparative Example 4 was repeated using the Composition of Comparative Example 3. The results are shown in Table 2.

EXAMPLE 4

The experiment of Comparative Example 4 was repeated using the composition of Example 2. The results are shown in Table 2.

EXAMPLE 5

The experiment of Comparative Example 4 was repeated using the composition of Example 3. The results are shown in Table 2.

TABLE 2

| Exposure Temp. (°C.) | Shoulder Sensitivity Change (f/stops) | | | | Toe Sensitivity Change (f/stops) | | | |
| --- | --- | --- | --- | --- | --- | --- | --- | --- |
| | Comp. Ex. 4 | Comp. Ex. 5 | Ex. 4 | Ex. 5 | Comp. Ex. 4 | Comp. Ex. 5 | Ex. 4 | Ex. 5 |
| 15 | −0.33* | −0.67* | −0.67* | −1.00* | 0.00* | 0.00* | 0.00* | −1.33 |
| 22 | −0.33* | −0.33* | −0.33* | −0.67* | −1.00* | −1.00* | −0.67* | −0.67* |
| 30 | 0.00* | 0.00* | 0.00* | 0.00* | −5.00 | −5.00 | −2.30 | 0.00* |
| 35 | 0.33* | 0.00* | — | — | — | — | −5.00 | — |
| 37 | — | — | — | 0.33* | — | — | — | 0.33* |
| 40 | 0.33* | 0.33* | 0.00* | — | — | — | — | — |
| 45 | — | — | — | 0.33* | — | — | — | 0.33* |
| 50 | −1.60 | 0.67* | −1.00* | — | — | — | — | — |
| 60 | −3.30 | 0.33* | −2.00 | — | — | — | — | — |
| 70 | −5.50 | −1.67 | −4.00 | 0.67* | — | — | — | 0.33* |

*acceptable performance

COMPARATIVE EXAMPLE 6

The microcapsules of Comparative Example 2 were maintained at 60° C. for 10 days and then exposed to a 150 watt tungsten halogen light source at a distance of 30 cm for 16 seconds. The loss in film speed, measured in steps, for the shoulder and toe, are shown in Table 3.

COMPARATIVE EXAMPLE 7

The experiment of Comparative Example 6 was repeated using the microcapsules of Comparative Example 3. The loss in film speed for the shoulder and toe are shown in Table 3.

EXAMPLE 6

The experiment of Comparative Example 6 was repeated, with the exception that 1.1 parts of BMPP were added to the internal phase of the microcapsules. The loss in film speed for the shoulder and toe are shown in Table 3.

EXAMPLE 7

The experiment of Comparative Example 6 was repeated using the microcapsules of Example 3. The loss in film speed for the shoulder and toe are shown in Table 3.

TABLE 3

| Sample | Film Speed Loss Over 10 Days | |
| --- | --- | --- |
| | Shoulder (steps) | Toe (steps) |
| Comparative Example 6 | 0.00* | −0.04* |
| Comparative Example 6 | −0.06* | −0.53* |
| Example 6 | −0.46 | −0.56 |
| Example 7 | −0.11* | −0.13* |

*acceptable performance

Having described the invention in detail and by reference to the preferred embodiments thereof, it will be apparent that modifications and variants are possible without departing from the scope of the appended claims.

What is claimed is:

1. A photohardenable composition comprising an addition polymerizable or crosslinkable material, a photoinitiator composition capable of initiating polymerization or crosslinking of said polymerizable or crosslinkable material, said photoinitiator comprising an ionic dye-reactive counter ion compound, and a pyrazoline-5-one which in the 1 position is unsubstituted or substituted with alkyl or aryl groups, in the 3 position is unsubstituted or substituted with alkyl or aryl groups, and in the 4 position is unsubstituted or substituted by alkyl, aryl, alkoxy, aryloxy, acyl, or monosubstituted amino groups.

2. The composition according to claim 1 wherein said polymerizable or cross-linkable material comprises an ethylenically unsaturated monomer.

3. The composition according to claim 2 wherein said photoiniiator comprises a cationic dye-borate anion complex.

4. The composition according to claim 3 wherein said cationic dye comprises a cyanine dye.

5. The composition according to claim 2 wherein said composition is microencapsulated with an image-forming agent.

6. The composition according to claim 5 wherein said microcapsules are coated onto the front or back surface of a substrate.

7. The composition of claim 1 wherein said pyrazolone is selected from the group consisting of 4-benzoyl-3-methyl-1-phenyl-2-pyrazoline-5-one, 3-methyl-1-phenyl-2-pyrazoline-5- one, picrolonic acid, 1-(2,4,6-trichlorophenyl)-3-(p-nitroanilino)-(p-nitroanilino)-2-pyrazoline-5-one, and 3-methyl-1-phenyl-2-pyrazoline-5-one.

8. The composition of claim 7 wherein said pyrazolone is 4-benzoyl-3-methyl-1-phenyl-2-pyrazoline-5-one.

9. The composition according to claim 1 wherein said composition additionally comprises a thiol.

10. A photohardenable composition comprising an addition polymerizable or crosslinkable material, a photoinitiator composition capable of initiating polymerization of crosslinking of said polymerizable or crosslinkable material, said photoinitiator comprising an ionic dye-reactive counter ion compound, and 1,5-dimethyl-2-phenyl-3-pyrazolone or 4-amino-antipyrine.

* * * * *